United States Patent
Hsu et al.

(10) Patent No.: US 8,836,067 B2
(45) Date of Patent: Sep. 16, 2014

(54) TRANSISTOR DEVICE AND MANUFACTURING METHOD THEREOF

(75) Inventors: Ming-Shun Hsu, Miaoli County (TW); Wen-Peng Hsu, New Taipei (TW); Ke-Feng Lin, Taipei (TW); Min-Hsuan Tsai, Tainan (TW); Chih-Chung Wang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 33 days.

(21) Appl. No.: 13/525,471

(22) Filed: Jun. 18, 2012

(65) Prior Publication Data

US 2013/0334600 A1    Dec. 19, 2013

(51) Int. Cl.
*H01L 27/146*    (2006.01)

(52) U.S. Cl.
USPC ....... 257/446; 257/59; 257/337; 257/E27.132

(58) Field of Classification Search
USPC .............................. 257/59, 337, 446, E27.132
See application file for complete search history.

(56) References Cited

U.S. PATENT DOCUMENTS

| | | |
|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |
| 6,277,757 B1 | 8/2001 | Lin |
| 6,297,108 B1 | 10/2001 | Chu |

(Continued)

OTHER PUBLICATIONS

Han et al. "CMOS Transistor Layout KungFu", 2005, http://www.eda-utilities.com, Lee Eng Han.

(Continued)

*Primary Examiner* — Julio J Maldonado
*Assistant Examiner* — Hajar Kolahdouzan
(74) *Attorney, Agent, or Firm* — WPAT, PC; Justin King

(57) ABSTRACT

A transistor device and a manufacturing method thereof are provided. The transistor device includes a substrate, a first well, a second well, a shallow trench isolation (STI), a source, a drain and a gate. The first well is disposed in the substrate. The second well is disposed in the substrate. The STI is disposed in the second well. The STI has at least one floating diffusion island. The source is disposed in the first well. The drain is disposed in the second well. The electric type of the floating diffusion island is different from or the same with that of the drain. The gate is disposed above the first well and the second well, and partially overlaps the first well and the second well.

14 Claims, 8 Drawing Sheets

(56) References Cited

U.S. PATENT DOCUMENTS

| | | |
|---|---|---|
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh et al. |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 7,719,064 B2 | 5/2010 | Wu |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 * | 6/2007 | Wu et al. ............... 257/371 |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0117122 A1 | 5/2010 | Benoit |
| 2010/0148250 A1 | 6/2010 | Lin |
| 2010/0213517 A1 | 8/2010 | Sonsky |
| 2011/0057263 A1 | 3/2011 | Tang |
| 2012/0193718 A1 * | 8/2012 | Jou et al. ............... 257/355 |

OTHER PUBLICATIONS

Sung et al. "High-side N-channel LDMOS for a High Breakdown Voltage", May 2011, vol. 58, No. 5, pp. 1411-1416, Journal of the Korean Physical Society.

* cited by examiner

US 8,836,067 B2

TRANSISTOR DEVICE AND MANUFACTURING METHOD THEREOF

BACKGROUND

1. Technical Field

The disclosure relates in general to a semiconductor device and a manufacturing method thereof, and more particularly to a transistor device and a manufacturing method thereof.

2. Description of the Related Art

With the development of semiconductor technology, varied semiconductor elements are invented. Those semiconductor elements are widely used in electric devices.

Transistor device is a solid state transistor element, used for being a voltage amplifier, an audio amplifier, a radio amplifier, a regulated power element or a switch. The transistor device has advantages of small volume, high efficiency, long life and high speed, so that the transistor device is widely used in electric devices. In recently year, a high voltage and high power transistor device has been invented.

SUMMARY

The disclosure is directed to a transistor device and a manufacturing method thereof. A shallow trench isolation has a floating diffusion island, so that the breakdown voltage can be increased and the turn-on-resistance (Ron) can be reduced.

According to a first embodiment of the present disclosure, a transistor device is provided. The transistor comprises a substrate, a first well, a second well, a shallow trench isolation (STI), a source, a drain and a gate. The first well is disposed in the substrate. The second well is disposed in the substrate. The STI is disposed in the second well. The STI has at least one floating diffusion island. The source is disposed in the first well. The drain is disposed in the second well. The electric type of the floating diffusion island is different from or the same with that of the drain. The gate is disposed above the first well and the second well, and partially overlaps the first well and the second well.

According to a second embodiment of the present disclosure, a manufacturing method of a transistor device is provided. The manufacturing method of the transistor device comprises the following steps. A substrate is provided. A first well is formed in the substrate. A second well is formed in the substrate. A shallow trench isolation (STI) having at least a floating diffusion island is formed in the second well. A source is formed in the first well. A drain is formed in the second well. The electric type of the floating diffusion island is different from or the same with that of the drain. A gate is formed above the first well and the second well. The gate partially overlaps the first well and the second well.

The above and other aspects of the disclosure will become better understood with regard to the following detailed description of the non-limiting embodiments. The following description is made with reference to the accompanying drawings.

DETAILED DESCRIPTION

Several embodiments are disclosed below for elaborating the invention. The following embodiments are for the purpose of elaboration only, not for limiting the scope of protection of the invention. Besides, secondary elements are omitted in the following embodiments to highlight the technical features of the invention.

Figure 1:
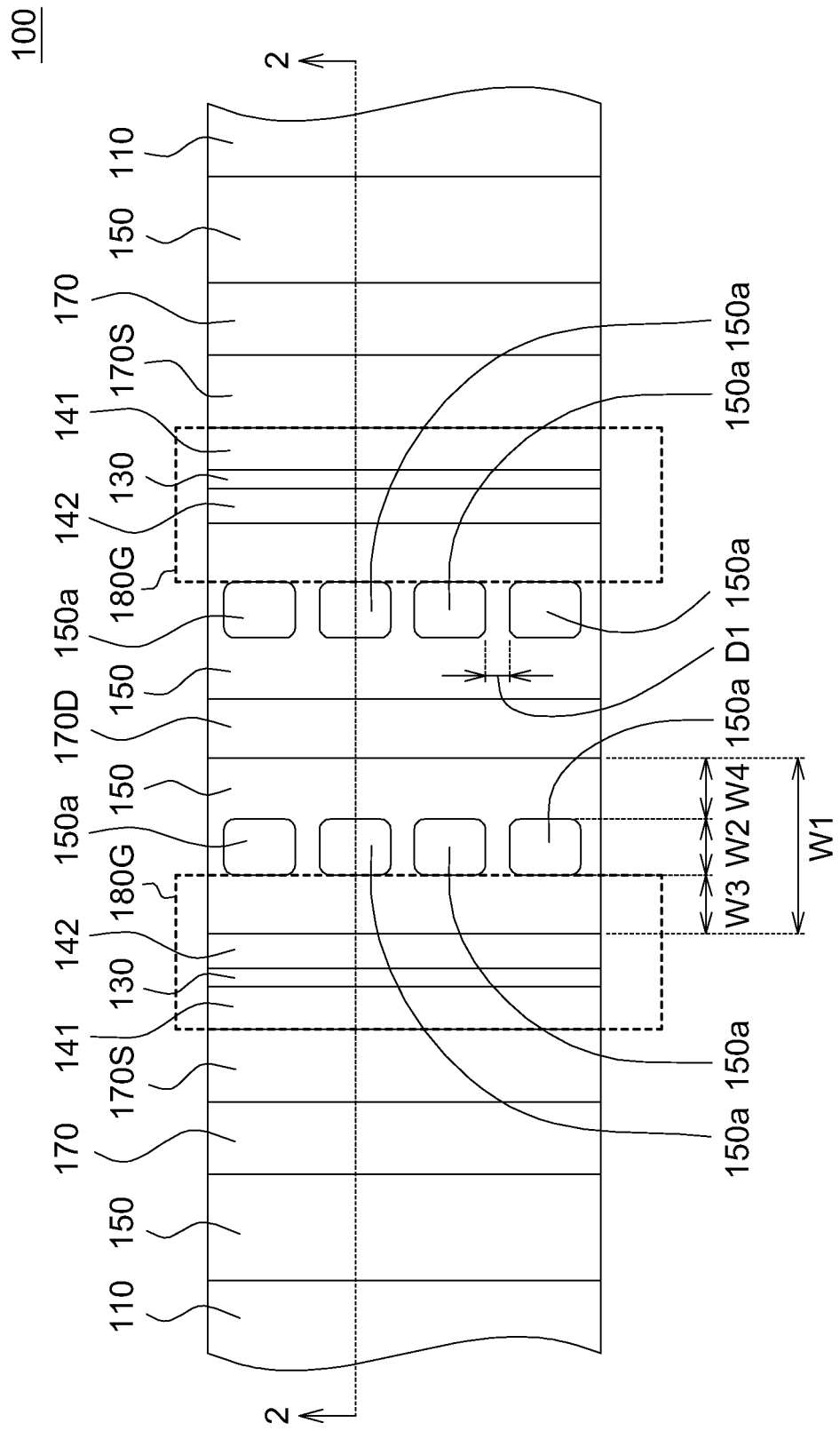
FIG. 1 shows a top view of a transistor device of one embodiment.
Figure 2:
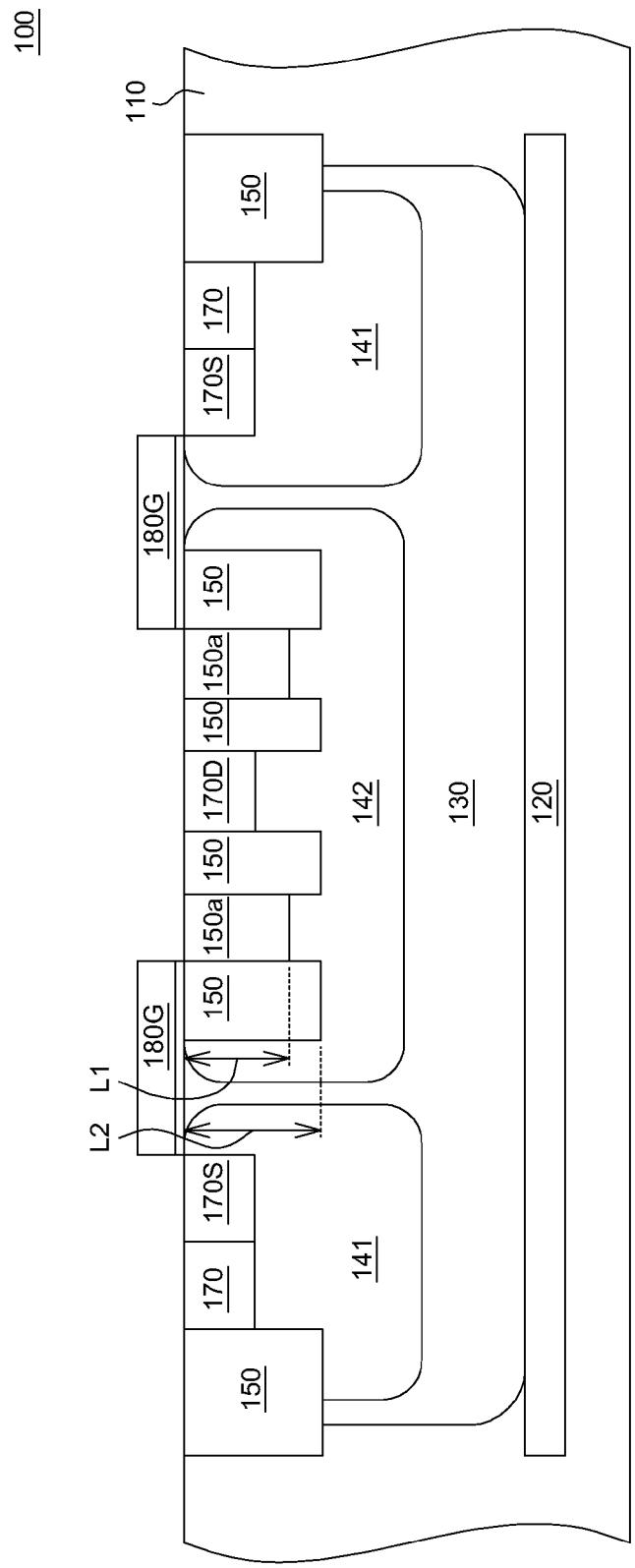
FIG. 2 shows a cross-sectional view of the transistor device of FIG. 1 along a cutting line 2-2.

Referring to FIGS. 1 to 2, FIG. 1 shows a top view of a transistor device 100 of one embodiment, and FIG. 2 shows a cross-sectional view of the transistor device 100 of FIG. 1 along a cutting line 2-2. The transistor device 100 includes a substrate 110, a first well 141, a second well 142, a shallow trench isolation (STI) 150, a source 170S, a drain 170D and a gate 180G.

The substrate 110 can be a P type silicon substrate or a N type silicon substrate, for example. The first well 141 and the second well 142 can be a P type well doped boron (B) or a N type well doped phosphorous (P), arsenic (As) or antimony (Sb), for example. In the present embodiment, the substrate 110 is a P type silicon substrate, and the first well 141 and the second well 142 are a P type well and a N type well respectively. The first well 141 and the second well 142 are disposed in the substrate 110. Referring to FIG. 2, the first well 141 and the second well 142 can be separated. In another embodiment, the first well 141 and the second well 142 can be connected.

Some STI 150 are disposed in the second well 142 and are surrounded by the second well 142. The STI 150 has at least one floating diffusion island 150a. Referring to FIG. 1, the STI 150 has several floating diffusion islands 150a. The floating diffusion islands 150a are located along a straight line and the floating diffusion islands 150a are not connected with each other.

The source 170S is disposed in the first well 141, and the drain 170D is disposed in the second well 142. The source 170S and the drain 170D can be N type heavily doping regions or P type heavily doping regions, for example. The gate 180G is disposed above the first well 141 and the second well 142 and partially overlaps the first well 141 and the second well 142. The material of the gate 180G can be polysilicon, for example. The source 170S, the drain 170N and the gate 180G form a laterally diffused metal oxide semiconductor (LDMOS).

Regarding the floating diffusion islands 150a, the floating diffusion islands 150a are disposed in the STI 150 and are not disposed below the STI 150. A channel between the drain 170D and the source 170S would not be lengthened, so that the turn-on-resistance (Ron) can be keep at a low level.

Moreover, each of the floating diffusion islands 150a is located between the drain 170D and the source 170S, such than the break voltage can be increased and the Ron can be reduced effectively.

Referring to FIG. 1, regarding to the STI 150 and each floating diffusion island 150a, the width W1 of the STI 150 is about three times the width W2 of each floating diffusion island 150a. Each floating diffusion island 150a is substantially located at the center of the STI 150. That is to say, the ratio of the width W3, the width W2 and the width W4 is about 1:1:1.

Further, regarding to FIG. 1, the number of the floating diffusion islands 150a can be larger than or equal to two, and form several island structures. In one embodiment, the number of the floating diffusion island 150a can be one, and form a single elongate structure. If the floating diffusion islands 150a are island structures, then the structural strength of the STI 150 can be kept. If the floating diffusion island 150a is a single elongate structure, the function of the floating diffusion island 150a can be brought fully.

Referring to FIG. 1, in the present embodiment, the floating diffusion islands 150a are island structures. The distance D1 between two adjacent floating diffusion islands 150a is larger than or equal to 0.3 micrometer (um) to keep the structural strength of the STI 150. However, according to different process generations or different design rules, the distance D1 can be changed and is not limited to 0.3 um.

Moreover, referring to FIG. 2, regarding the depth L1 of the floating diffusion islands 150a, if the depth L1 of the floating diffusion islands 150a is larger, then the function of the floating diffusion islands 150a can be brought more. However, the depth L1 of the floating diffusion islands 150a must be less than the thickness L2 of the STI 150 to avoid to change the channel between the drain 170D and the source 170S.

Referring to FIG. 2, regarding to the relationship between the gate 180G and the floating diffusion islands 150a, the gate 180G and the floating diffusion islands 150a can be separated without any overlapping, or partially overlapped. If the gate 180G and the floating diffusion islands 150a are partially overlapped, the breakdown voltage and the Ron will be effected accordingly.

Please referring to FIG. 2, regarding to the concentration and the electric type of the floating diffusion islands 150a, the transistor device 100 further includes a deep well 130 and a buried layer 120. The deep well 130 and the buried layer 120 can be N type or P type, for example. In the present embodiment, the deep well 130 and the buried layer 120 are N type. The deep well 130 is disposed above the substrate 110. The second well 142 and the first well 141 are disposed in the deep well 130. The electric type of the floating diffusion islands 150a and that of the drain 170D can be different or the same. It is proper that the electric type of the floating diffusion islands 150a is the same with the drain 170D. The concentration of the floating diffusion islands 150a and the deep well 130 have the same order of magnitude.

Please referring to FIGS. 3A to 3E, FIGS. 3A to 3E show a flowchart of the manufacturing method of the transistor device according to the embodiment. Firstly, referring to FIG. 3A, the substrate 110 is provided. Next, the buried layer 120 and the deep well 130 are formed in the substrate 110. Afterwards, the first well 141 is formed in the deep well 130. Then, the second well 142 is formed in the deep well 130. In one embodiment, after providing the substrate 110, the buried layer 120 is formed at the top of the substrate 110. Then an epitaxy layer is formed above the buried layer 120 for disposing the deep well 130, the first well 141 and the second well 142.

Figure 3A:
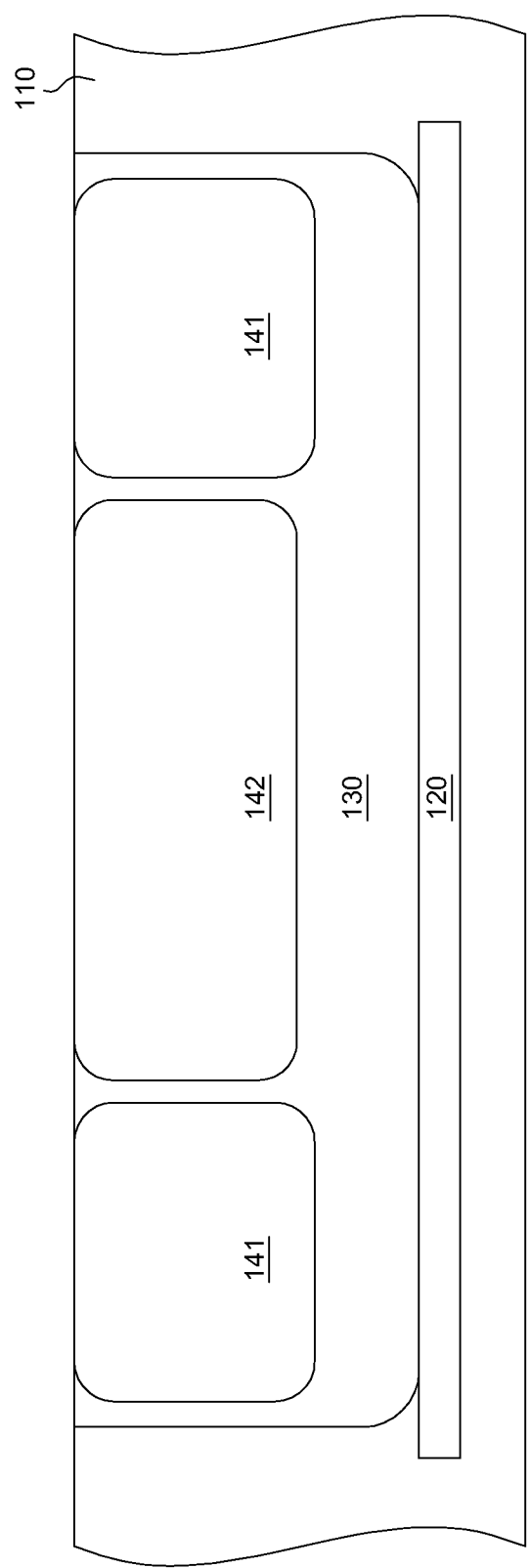
FIGS. 3A to 3E show a flowchart of a manufacturing method of the transistor device according to one embodiment.
Figure 3B:
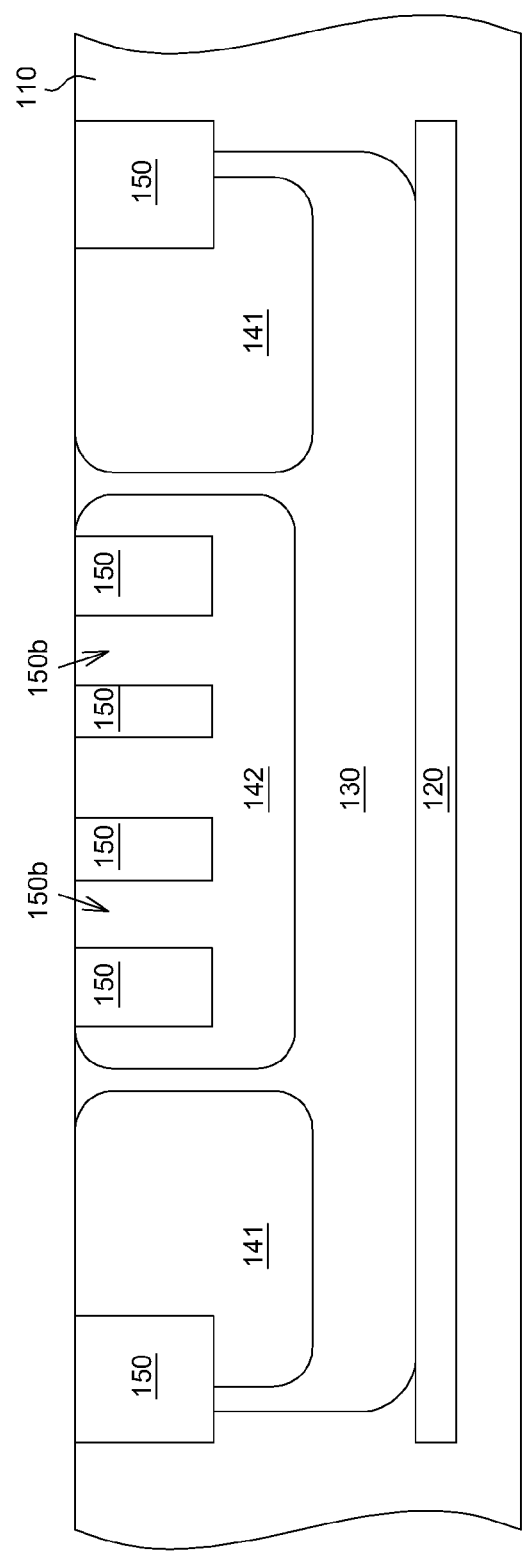

Afterwards, referring to FIG. 3B, the STI 150 is formed in the second well 142 and gaps 150b between the STI 150 are defined simultaneously.

Figure 3C:
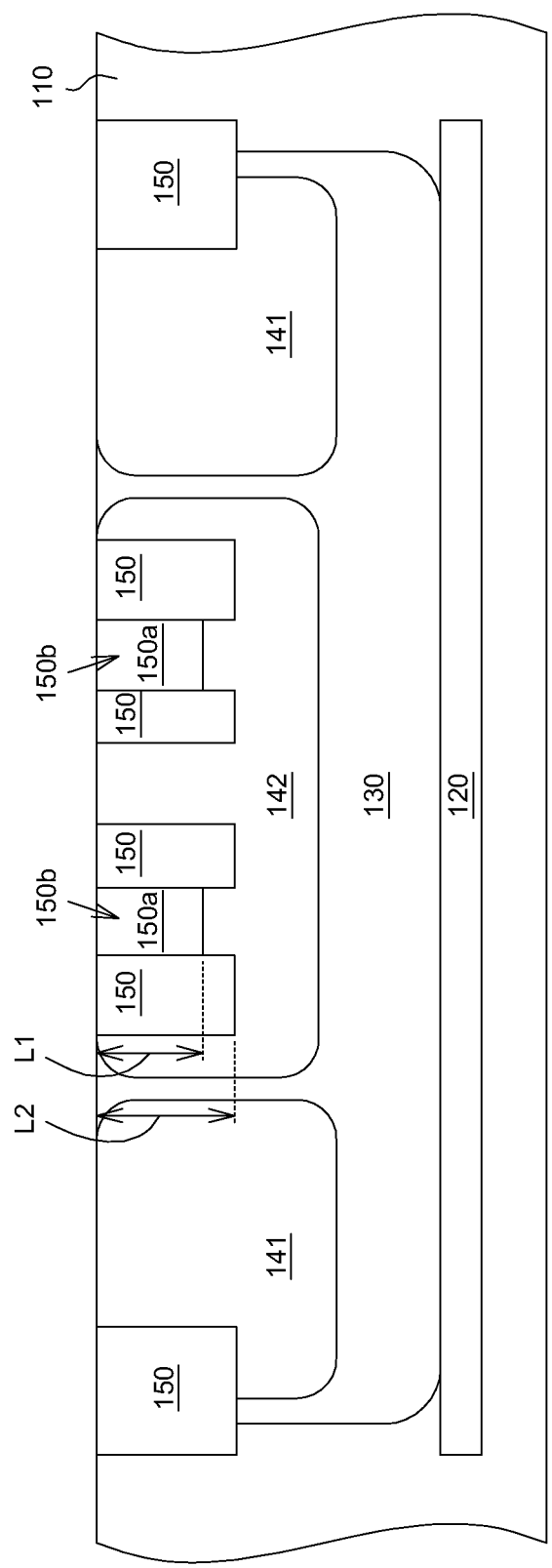

Then, referring to FIG. 3C, the floating diffusion islands 150a are formed in the gaps 150b by using a mask (not shown) to define an implanting area. In this step, the depth L1 of the floating diffusion island 150a is controlled to be less than the thickness L2 of the STI 150 by controlling the process time and the energy.

Figure 3D:
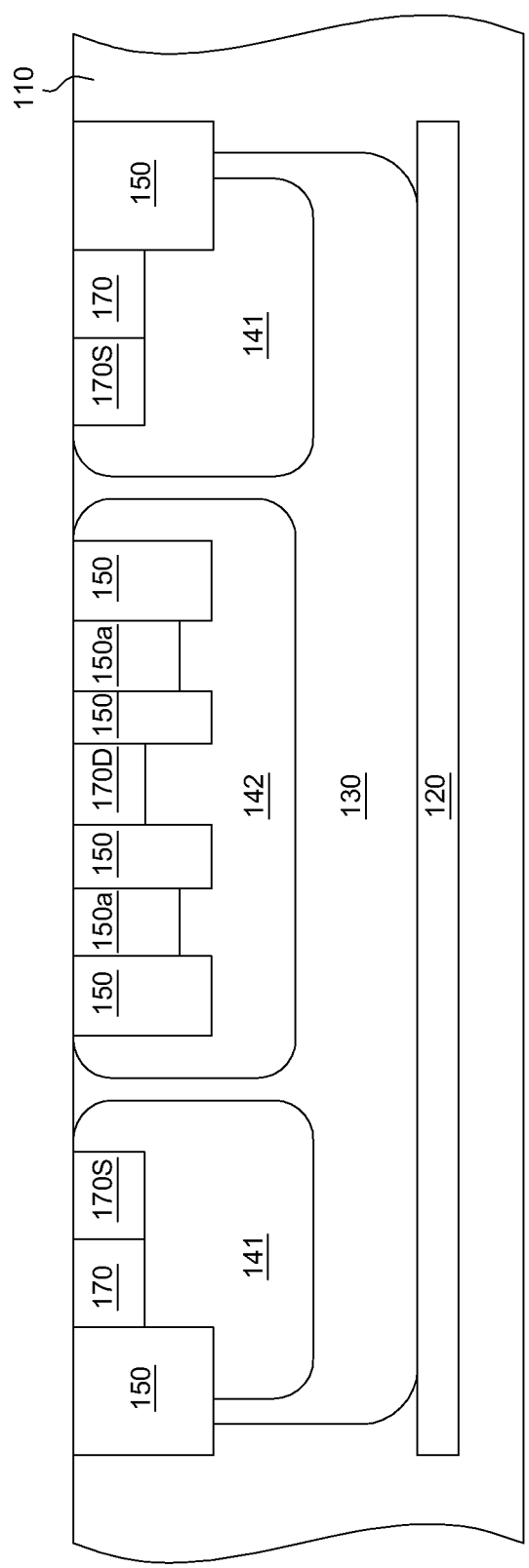

Afterwards, referring to FIG. 3D, the source 170S and a heavily doping region 170 are formed in the first well 141 and the drain 170D is formed in the second well 142 by using a mask (not shown) to define an implanting area.

Figure 3E:
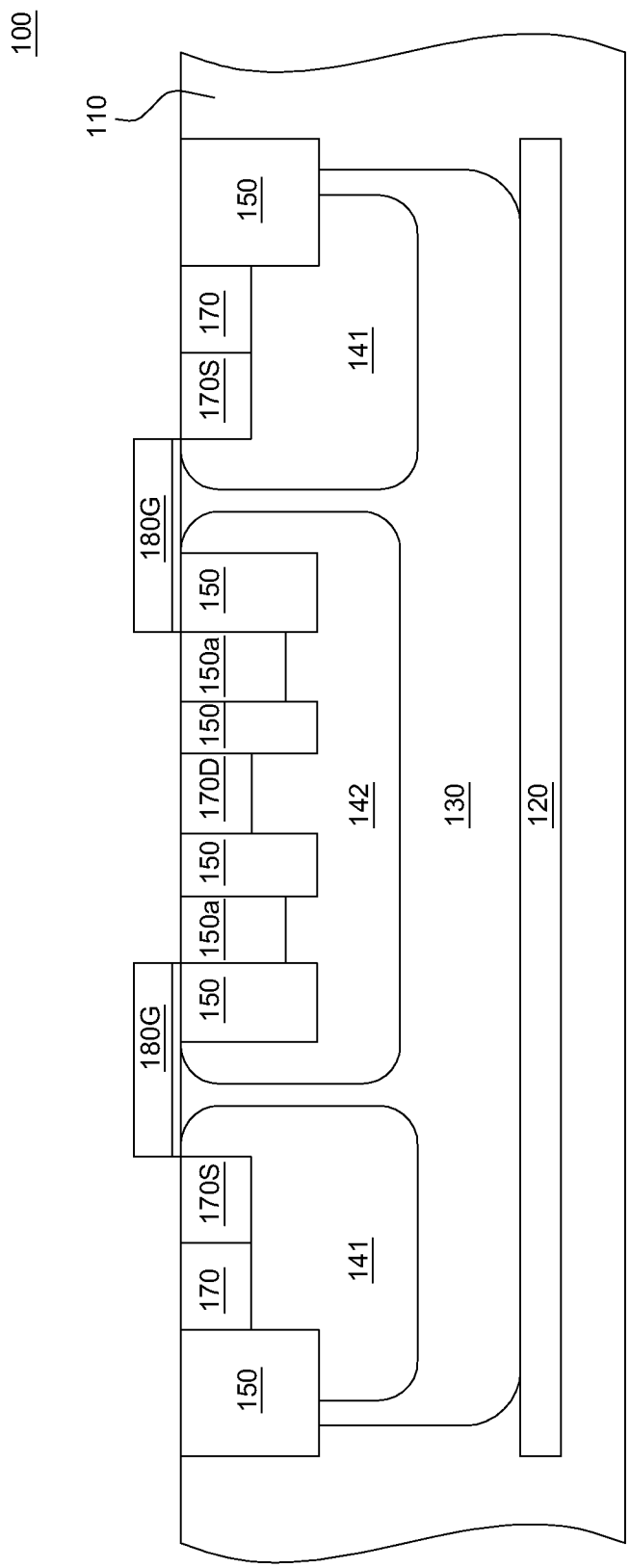
Figure 4:
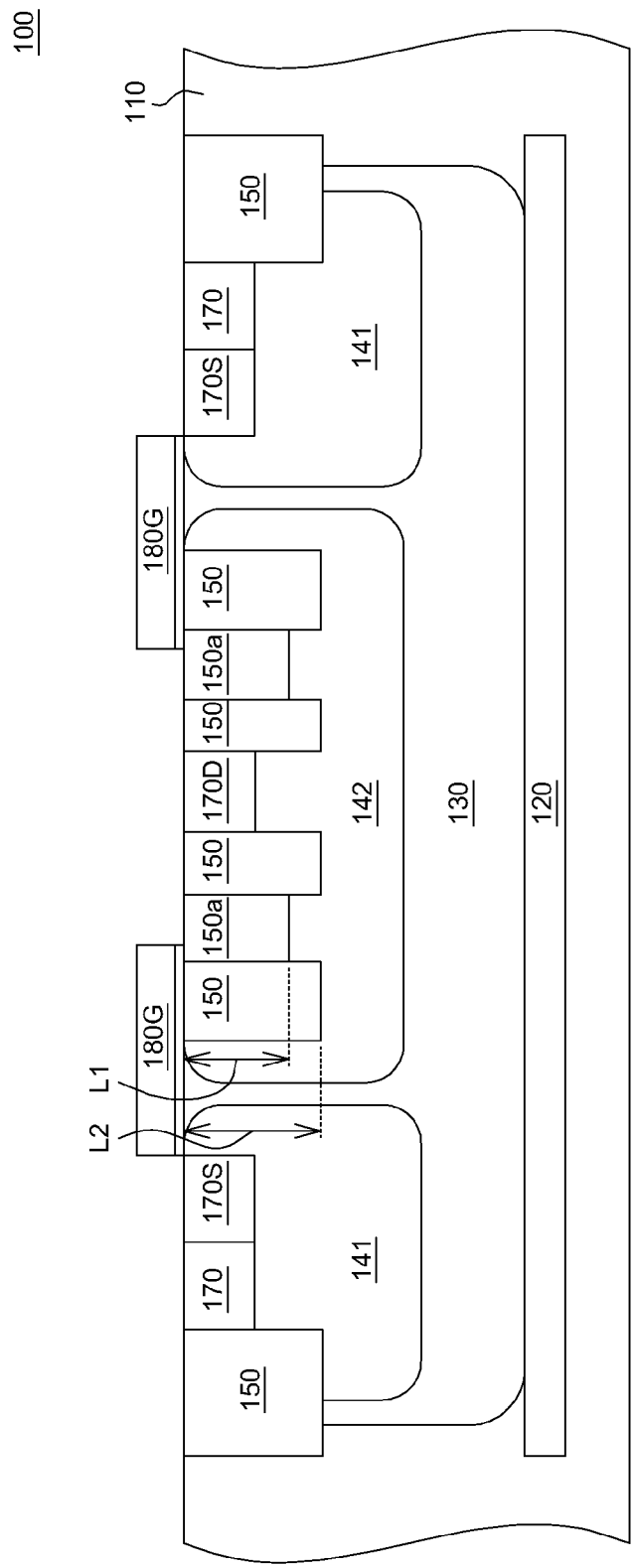
FIG. 4 shows a cross-sectional view of another preferred embodiment of transistor device.

Afterwards, referring to FIG. 3E, the gate 180G is formed above the first well 141 and the second well 142. After those steps are performed, the transistor device 100 is manufactured.

In the present embodiment, it is no needed to increase the manufacturing cost of the manufacturing method of the transistor device 100. The floating diffusion islands 150a can be disposed in the STI 150 during the manufacturing method, such that the breakdown voltage can be increased and the Ron can be decreased.

While the disclosure has been described by way of example and in terms of the exemplary embodiments, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A transistor device, comprising:
    a substrate;
    a first well, disposed in the substrate;
    a second well, disposed in the substrate;
    a shallow trench isolation (STI), disposed in the second well, wherein the STI surrounds and is immediately adjacent to at least one floating diffusion island;
    a source, disposed in the first well;
    a drain, disposed in the second well, the electric type of the floating diffusion island is different from or the same with that of the drain; and
    a gate, disposed above the first well and the second well and partially overlapping the first well and the second well, wherein the gate and the floating diffusion island are partially overlapped with each other.

2. The transistor device according to claim 1, wherein a depth of the floating diffusion island is less than a thickness of the STI.

3. The transistor device according to claim 1, wherein a width of the STI is three times that of the floating diffusion island.

4. The transistor device according to claim 1, wherein the floating diffusion island is substantially disposed at a center of the STI.

5. The transistor device according to claim 1, wherein the number of the at least one floating diffusion island is larger than or equal to two, and the floating diffusion islands are isolated with each other.

6. The transistor device according to claim 5, wherein a distance between two adjacent floating diffusion islands is larger than or equal to 0.3 micrometer (um).

7. The transistor device according to claim 1, further comprising:
    a deep well, disposed in the substrate, wherein the second well and the first well are disposed in the deep well, and the concentration of the floating diffusion island and the deep well have the same order of magnitude.

8. A manufacturing method of a transistor device, comprising:
    providing a substrate;
    forming a first well in the substrate;
    forming a second well in the substrate;
    forming a shallow trench isolation (STI) in the second well, wherein the STI surrounds and immediately adjacent to at least one floating diffusion island;
    forming a source in the first well;

forming a drain in the second well, the electric type of the floating diffusion island is different from or the same with that of the drain; and forming a gate above the first well and the second well, the gate partially overlapping the first well and the second well, wherein the gate and the floating diffusion island are partially overlapped with each other.

9. The manufacturing method of the transistor device according to claim 8, wherein in the step of forming the STI, a depth of the floating diffusion island is less than a thickness of the STI.

10. The manufacturing method of the transistor device according to claim 8, wherein in the step of forming the STI, a width of the STI is three times that of the floating diffusion island.

11. The manufacturing method of the transistor device according to claim 8, wherein in the step of forming the STI, the floating diffusion island is substantially disposed at a center of the STI.

12. The manufacturing method of the transistor device according to claim 8, wherein in the step of forming the STI, the number of the at least one floating diffusion islands is larger than or equal to two.

13. The manufacturing method of the transistor device according to claim 12, wherein in the step of forming the STI, a gap between two adjacent floating diffusion islands is larger than or equal to 0.3 micrometer (um).

14. The manufacturing method of the transistor device according to claim 8, wherein before the steps of forming the second well and the first well, the manufacturing method further comprises:

forming a deep well on the substrate, wherein the second well and the first well are disposed in the well, and a concentration of the floating diffusion island and the deep well have the same order of magnitude.

* * * * *